United States Patent
Sanada

(10) Patent No.: US 8,826,518 B2
(45) Date of Patent: Sep. 9, 2014

(54) ELECTRODE FORMING APPARATUS

(75) Inventor: Masakazu Sanada, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 212 days.

(21) Appl. No.: 13/011,245

(22) Filed: Jan. 21, 2011

(65) Prior Publication Data

US 2011/0225815 A1 Sep. 22, 2011

(30) Foreign Application Priority Data

Mar. 18, 2010 (JP) .................................. 2010-062160

(51) Int. Cl.
  *B23P 19/00* (2006.01)
  *H05K 13/04* (2006.01)
  *H01L 31/0224* (2006.01)

(52) U.S. Cl.
  CPC ......... *H01L 31/022425* (2013.01); *Y02E 10/50* (2013.01)
  USPC .................................. 29/729; 29/721; 29/759

(58) Field of Classification Search
  USPC ........... 29/729, 711, 742, 759, 783, 791, 829, 29/846, 874; 134/26, 34, 94.1, 172, 902; 313/495, 582, 609; 427/356, 510
  See application file for complete search history.

(56) References Cited

U.S. PATENT DOCUMENTS

| 2005/0205113 A1* | 9/2005 | Tamada et al. ................... 134/26 |
| 2006/0043892 A1* | 3/2006 | Yabe et al. ..................... 313/582 |
| 2006/0099535 A1 | 5/2006 | Yabe |
| 2007/0295381 A1 | 12/2007 | Fujii et al. |

FOREIGN PATENT DOCUMENTS

| JP | 2003-536240 | 12/2003 |
| JP | 2005-349357 | 12/2005 |
| JP | 2005-353851 | 12/2005 |
| JP | 2006-138911 | 6/2006 |
| WO | WO00/44051 | 7/2000 |

OTHER PUBLICATIONS

Notice of Allowance received Jun. 12, 2012 in corresponding JP application 2010-062160 (reference JP 2006-138911 previously submitted to USPTO).

* cited by examiner

*Primary Examiner* — Thiem Phan
(74) *Attorney, Agent, or Firm* — Ostrolenk Faber LLP

(57) ABSTRACT

The invention aims at reducing unevenness at the intersections of mutually crossing electrodes with a method of and an apparatus for forming electrodes on a substrate. After forming a number of finger electrodes on a substrate, wide bus electrodes intersecting them are formed by application of an application liquid. Upon applying the application liquid which contains an electrode material and a photo-curing resin to the substrate, the application liquid is irradiated with UV light after a predetermined time and the application liquid is thus made to harden. A time difference since applying until light irradiation is set based on the result of measurement on changes of the height of the application liquid experimentally applied.

8 Claims, 10 Drawing Sheets

ELECTRODE FORMING APPARATUS

CROSS REFERENCE TO RELATED APPLICATION

The disclosure of Japanese Patent Application No. 2010-062160 filed on Mar. 18, 2010 including specification, drawings and claims is incorporated herein by reference in its entirety.

BACKGROUND OF THE INVENTION

1. Field of the Invention

The present invention relates to a method of and an apparatus for forming electrodes on a substrate, for example, for forming electrodes within a photoelectric conversion surface of a substrate for photoelectric conversion element such as a solar cell substrate.

2. Description of the Related Art

As a technique for forming a predetermined pattern on a substrate, a pattern drawing technique on a substrate using an application liquid which contains a patterning material discharged from a nozzle is known. According to JP-A-2006-138911 for instance, a nozzle moving in one direction relative to a substrate discharges a paste-like patterning material which contains a photo-curing resin, thereby applying the patterning material to the substrate, irradiation of ultraviolet light hardens the resin, and a pattern is formed on the substrate. Further, according to this technique, gnarl portions having different pattern widths are formed at regular intervals as any one of the scanning speed, the discharge volume and the exposure volume is changed regularly while the nozzle scans the substrate.

It should be possible to apply this technique described in the patent publication mentioned above to formation of electrodes for a photoelectric conversion element such as a solar cell. According to JP-A-2005-353851 for example, a number of narrow and line-like (linear) electrodes called finger electrodes and wide electrodes called bus electrodes which cross the finger electrodes are formed in a photoelectric conversion surface of a solar cell.

When such electrodes crossing each other are formed as a result of application of an application liquid, the application liquid builds thick upon existing electrodes at the intersections with the electrodes, thereby making the top surfaces of the electrodes having different heights from each other. In the case of a solar cell for instance, a metal electrode foil attached to the top surfaces of the electrodes at a later step can therefore adhere only less tightly to the top surfaces of the electrodes, which is a problem that the device poorly performs and is less durable.

SUMMARY OF THE INVENTION

The present invention has been made in light of the problem above, and accordingly aims at providing, for a method of and an apparatus for forming electrodes on a substrate, a technique with which it is possible to reduce different heights at the intersections of the mutually crossing electrodes.

To achieve the object above, the electrode forming method according to one aspect of the invention comprises: a finger electrode forming step of forming finger electrodes extending in a first direction in a surface of a substrate; an applying step of moving a nozzle, which discharges an application liquid containing an electrode material, relative to the substrate in a second direction which is different from the first direction and applying the application liquid to the substrate while making the application liquid crossing the finger electrodes; a hardening step of hardening the application liquid after a predetermined time since applying the application liquid to the substrate and accordingly forming bus electrodes; and a time setting step of setting, prior to execution of the hardening step, the predetermined time based upon a flattening time for flattening the application liquid applied to intersections with the finger electrodes.

In this structure according to the invention, instead of hardening the application liquid right after application of the application liquid which will become the bus electrodes, the application liquid is hardened after the time which is set in accordance with the flattening time of the application liquid. Immediately after application of the application liquid to the substrate on which the finger electrodes have already been formed, the application liquid over the finger electrodes have embossments, and therefore, if the application liquid is left to harden as is, the electrode patterns will be uneven with respect to height. The liquid level of the application liquid which has not hardened yet, due to its own liquidity, gets flattened out (leveling) gradually. The time necessary for this is herein referred to as the "flattening time". That is, an application liquid whose flattening time is long will not easily lose its shape upon application and remain built up thick for a long time, whereas an application liquid whose flattening time is short will lose its embossed profile over a short period of time after applied. Hence, as the time since application until hardening is set in accordance with the speed at which the application liquid levels out, the embossments at the intersections of the finger electrodes and the bus electrodes are reduced, so that the electrodes with less height differences are obtained.

In general, many and narrow finger electrodes are provided and wider yet a fewer bus electrodes are provided. Where finger electrodes are formed first, an application liquid applied upon the finger electrodes will not stay long on the electrodes because of the narrow width of the electrodes and will lose its embossments in a short time. In the event that finger electrodes are formed by applying after forming bus electrodes, embossments of an application liquid on the wide bus electrodes will take a longer time to disappear, and the application liquid on the substrate other than on the bus electrodes will spread out during this, thereby making it difficult to obtain the finger electrodes having a high aspect ratio. In this sense, a desirable order is to form narrow finger electrodes first and form wider bus electrodes after that.

To achieve the object above, the electrode forming method according to other aspect of the invention comprises: a finger electrode forming step of forming finger electrodes extending in a first direction in a surface of a substrate; an applying step of moving a nozzle, which discharges an application liquid containing an electrode material, relative to the substrate in a second direction which is different from the first direction and applying the application liquid to the substrate while making the application liquid crossing the finger electrodes; and a hardening step of hardening the application liquid after a predetermined time since applying the application liquid to the substrate and accordingly forming bus electrodes, wherein the predetermined time since applying the application liquid until execution of the hardening step is adjusted, thereby controlling the electrode heights at intersections of the finger electrodes and the bus electrodes.

In this structure according to the invention, the bus electrodes are formed by applying the application liquid on the substrate which already seats the finger electrodes. At that stage, the time since application of the application liquid until hardening of the application liquid is adjusted so that spreading of the application liquid at the intersections with the finger electrodes can be controlled, and as in the invention described above, electrodes having less height differences can be formed with reduced embossments at the intersections of the finger electrodes and the bus electrodes.

To achieve the object above, the electrode forming apparatus according to the invention comprises: a substrate holder which holds a substrate which seats finger electrodes which extend in a first direction; a nozzle which discharges an application liquid which contains an electrode material; a mover which moves the nozzle relative to the substrate in a second direction which is different from the first direction; a hardener which hardens the application liquid applied to the substrate; and an adjuster which adjusts a time since application of the application liquid to the substrate until hardening performed by the hardener.

With this structure according to the invention, as in the invention directed to the electrode forming method described above, when forming the bus electrodes by application of the application liquid to the substrate on which the finger electrodes have already been formed, the adjuster can adjust the time since application of the application liquid until hardening of the application liquid. It is therefore possible to control spreading of the application liquid at the intersections with the finger electrodes, and as in the invention described above, form the electrodes having less height differences with reduced embossments at the intersections of the finger electrodes and the bus electrodes.

The above and further objects and novel features of the invention will more fully appear from the following detailed description when the same is read in connection with the accompanying drawing. It is to be expressly understood, however, that the drawing is for purpose of illustration only and is not intended as a definition of the limits of the invention.

DETAILED DESCRIPTION OF THE PREFERRED EMBODIMENTS

Figure 1:
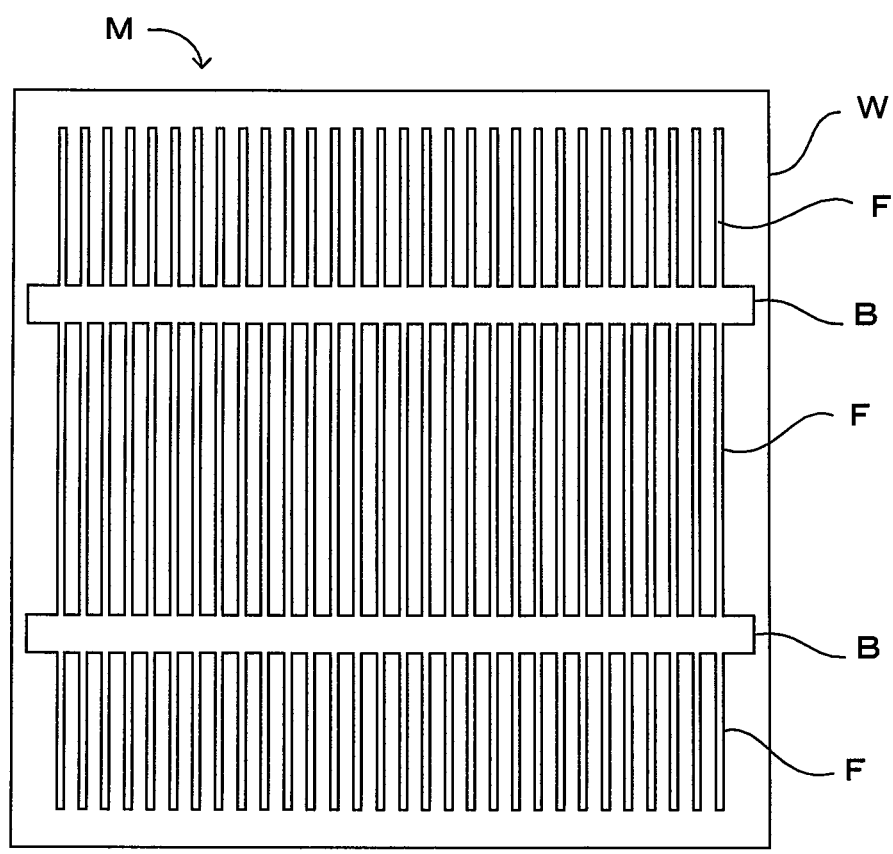
FIG. 1 is a drawing which shows an example of a solar cell module manufactured according to the invention.

FIG. 1 is a drawing which shows an example of a solar cell module manufactured according to the invention. In this solar cell module M, finger electrodes F and bus electrodes B are provided on the top surface (namely, an incident light receiving surface) of a substrate W which comprises a photoelectric conversion layer. The finger electrodes F are electrodes which are formed narrow so as not to block incident light yet thick so as to ensure low resistance. A great number of the line-like (linear) finger electrodes F are provided parallel to each other. Meanwhile, the bus electrodes B are formed wide so as to make it possible to pull out electric charges collected by the finger electrodes F to outside only with a little loss, and one or a few such bus electrodes are provided crossing each finger electrode F. For the reasons of later steps and improvement of the device capability, the finger electrodes F and the bus electrodes B are made to have approximately same heights. The widths of the bus electrodes B and the finger electrodes F are typically about 2 mm and 100 µm, respectively. Their heights are roughly 20 µm.

The processing for forming the electrodes having the above-mentioned structures on the surface of the substrate W will now be described in detail. The finger electrodes F and the bus electrodes B described above are both formed as the substrate W is coated by a nozzle scan method with a paste-like application liquid which contains an electrode material (such as silver powder) and a photo-curing resin. The application liquid hardens under irradiation of light which may for example be UV light. The viscosity of the application liquid is typically about 50 Pa·s or smaller.

In the event electrodes, interconnections and the like are formed by applying such a application liquid, the application liquid builds up thick at the intersections of the electrodes, the interconnections, etc., which could sacrifice the flatness of the surface. In other words, in the case that some electrodes have already been formed on the substrate and the application liquid from the nozzle is applied crossing the existing electrodes, if the application liquid applied upon these electrodes hardens as is, the height will become different there from the heights at the other sections of the electrodes. On the contrary, if the application liquid is made not to harden immediately but left as such, due to the flattening (leveling) effect of the liquid, the height differences of the liquid level of the application liquid will disappear gradually. The time needed for this to occur will hereinafter be referred to as the "flattening time." As the time difference from applying to hardening is controlled based upon the concept of the flattening time, embossments over the electrodes are eliminated.

Figure 2A:
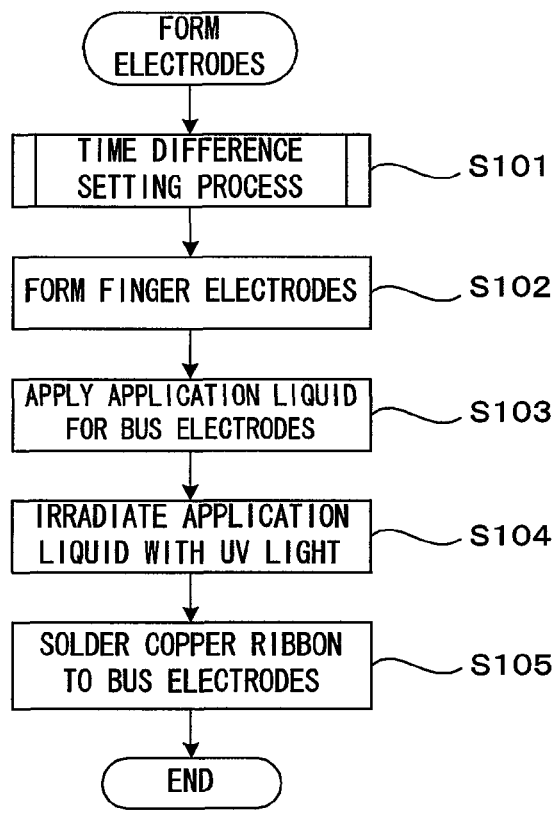
FIG. 2A is a flow chart which shows the sequence for forming electrodes according to the invention.

FIG. 2A is a flow chart which shows the sequence for forming electrodes according to the invention. The sequence of the electrode forming process as a whole will be briefly outlined first, followed later by detailed description of what is performed at each one of process steps. First, the time difference setting process is executed (Step S101) as shown in FIG. 2A. This process permits setting the time difference from applying the application liquid to the substrate for forming bus electrodes until irradiation of the application liquid with light.

Once the time difference has been set, the finger electrodes F are formed (Step S102). When forming the finger electrodes F, application of the application liquid and light irradiation are performed without any intermittence. The application liquid for bus electrodes B is thereafter applied to the substrate W which now seats the finger electrodes F in such a manner that the application liquid intersects each one of the many finger electrodes F (Step S103). The application liquid is irradiated with light and hardens after the time difference which was set through the time difference setting process (Step S104), thereby forming the bus electrodes B. In this manner, the finger electrodes F are formed first and the bus electrodes B are formed next according to the electrode forming method of the invention. A copper ribbon for extracting an electric current to outside is attached by welding for instance to the bus electrodes B thus formed (Step S105).

Figure 2B:
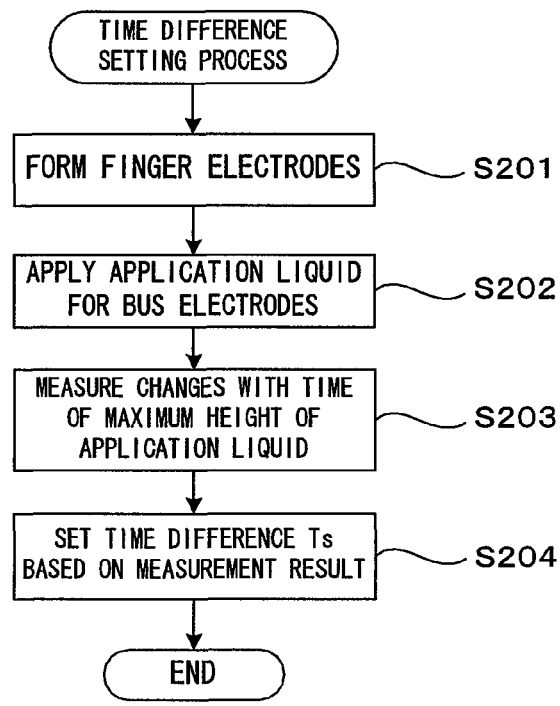
FIG. 2B is a flow chart of the time difference setting process.
Figure 3A:
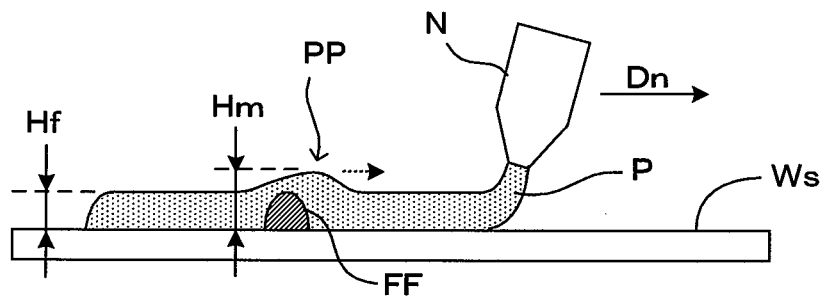
FIGS. 3A, 3B and 3C are drawings which schematically show the principle of the time difference setting process.
Figure 3B:
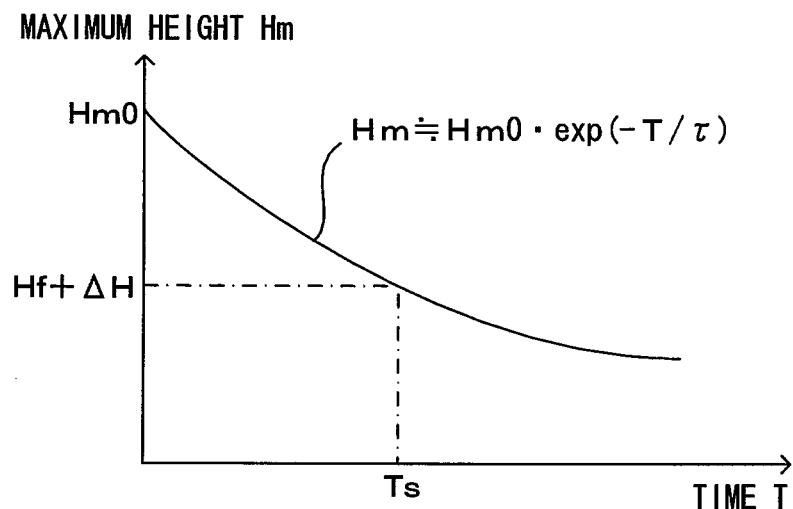
Figure 3C:
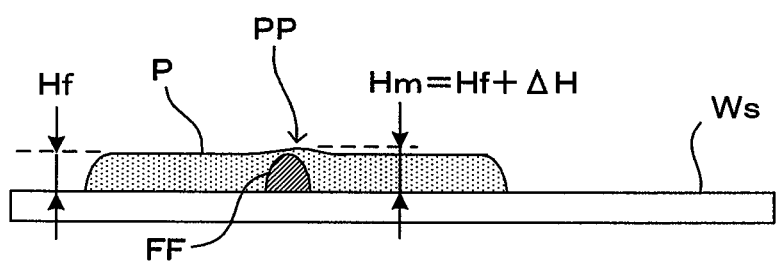

The time difference setting process will now be described with reference to FIGS. 2B, 3A, 3B and 3C. FIG. 2B is a flow chart of the time difference setting process. FIGS. 3A, 3B and 3C are drawings which schematically show the principle of the time difference setting process. During this process, first, a sample substrate Ws is prepared and finger electrodes FF are formed on the sample substrate Ws (Step S201). While it is ideal that the finger electrodes FF have similar cross-sectional shapes (in terms of width and height) as those of the finger electrodes F which will be used in the solar cell module M, the number of the finger electrodes FF may be smaller than that of the finger electrodes F.

Next, an application liquid P is applied to the sample substrate WS so as to traverse the earlier formed finger electrodes FF while moving a nozzle N for discharging the application liquid for bus substrates relative to the substrate WS along a direction Dn (Step S202). At this stage, the height of the application liquid P is preferably about the same as the height Hf of the finger electrodes FF as shown in FIG. 3A.

This makes the application liquid P build up in the vicinity of the intersections with the finger electrodes FF. According to an experiment by the inventors of the invention, the embossments PP would not be created right above the finger electrodes FF but would be located adjacent to and on the downstream side to the finger electrodes FF in the direction Dn of the movement of the nozzle N. In short, there is a tendency that the application liquid P builds up the greatest immediately after the nozzle N has moved passed right above the finger electrodes FF.

Following this, changes with time of the height of the embossment PP, namely, the maximum height Hm of the application liquid is measured (Step S203). Considering from the fact above supported by the experiments, it is desirable to measure the maximum height Hm at the downstream-side adjacent position to the finger electrode FF in the direction Dn of the movement of the nozzle N. Since the application liquid contained within the embossment PP gradually radiates and gets flattened, the maximum height Hm decreases with time from the maximum height value Hm0 which is the maximum height right after application as shown in FIG. 3B. A change of the height Hm for the time period T can be approximated by the formula below:

$$Hm \approx Hm0 \cdot exp(-T/\tau)$$

where $\tau$ is a parameter for the speed at which the height of the embossment PP changes, that is, a value corresponding to the flattening time described earlier.

The time difference Ts since applying the application liquid for forming the bus electrodes until irradiation with light is set based upon the measurement result on the changes of the height of the embossment PP thus calculated (Step S204). As mentioned above, the application liquid builds up into embossments near the intersections with the finger electrodes immediately after applying, and therefore, if light is irradiated right after applying, the application liquid will harden as it has built up and leave undulations in the bus electrodes. This could lead to poor adhesion between the electrodes and a copper ribbon which will be later put to the electrodes. Meanwhile, although the embossments will disappear with time and be leveled out almost flat eventually, too long a stay time will make the application liquid flow out beyond the necessary extent and the heights of the bus electrodes become too short and result in uneven heights of the finger electrodes and the bus electrodes.

Noting this, a maximum permissible height difference ΔH from the height of the electrode is set in advance as shown in FIG. 3C. Further, the preferable time difference Ts since application of the application liquid until light irradiation upon the application liquid is defined as the time at which the maximum height Hm of the embossment PP is equal to the sum of the height Hf of the finger electrode and the permissible height difference ΔH. In short, light is irradiated after the time Ts since application of the application liquid for bus electrodes, thus making it possible to contain the height difference between the finger electrode and the bus electrode to or below the permissible height difference ΔH. The permissible height difference ΔH needs not strictly be zero: the permissible height difference ΔH may be appropriately set in accordance with the pitches of the finger electrodes, the width of the bus electrodes, the thickness of the copper ribbon and the like so as to be able to weld the copper ribbon to the bus electrodes without fail.

The preferable time difference Ts set in this manner is used as described below when subsequently forming the electrodes. That is, after application of the application liquid for bus electrodes B to the substrate W on which the finger electrodes F have already been formed, light is irradiated upon the application liquid as the time Ts elapses since the application. This ensures that the height differences between the finger electrodes F and the bus electrodes B are equal to or smaller than the permissible height difference ΔH.

The time difference Ts needs not be set every time an electrode is formed on the substrate. Since the time difference remains approximately the same as long as the materials to use, such as the types of the substrate and the application liquid and the dimensions of the electrodes, and the process to use remain the same, the set value previously used may be used directly unless the materials and the process are changed.

Figure 4:
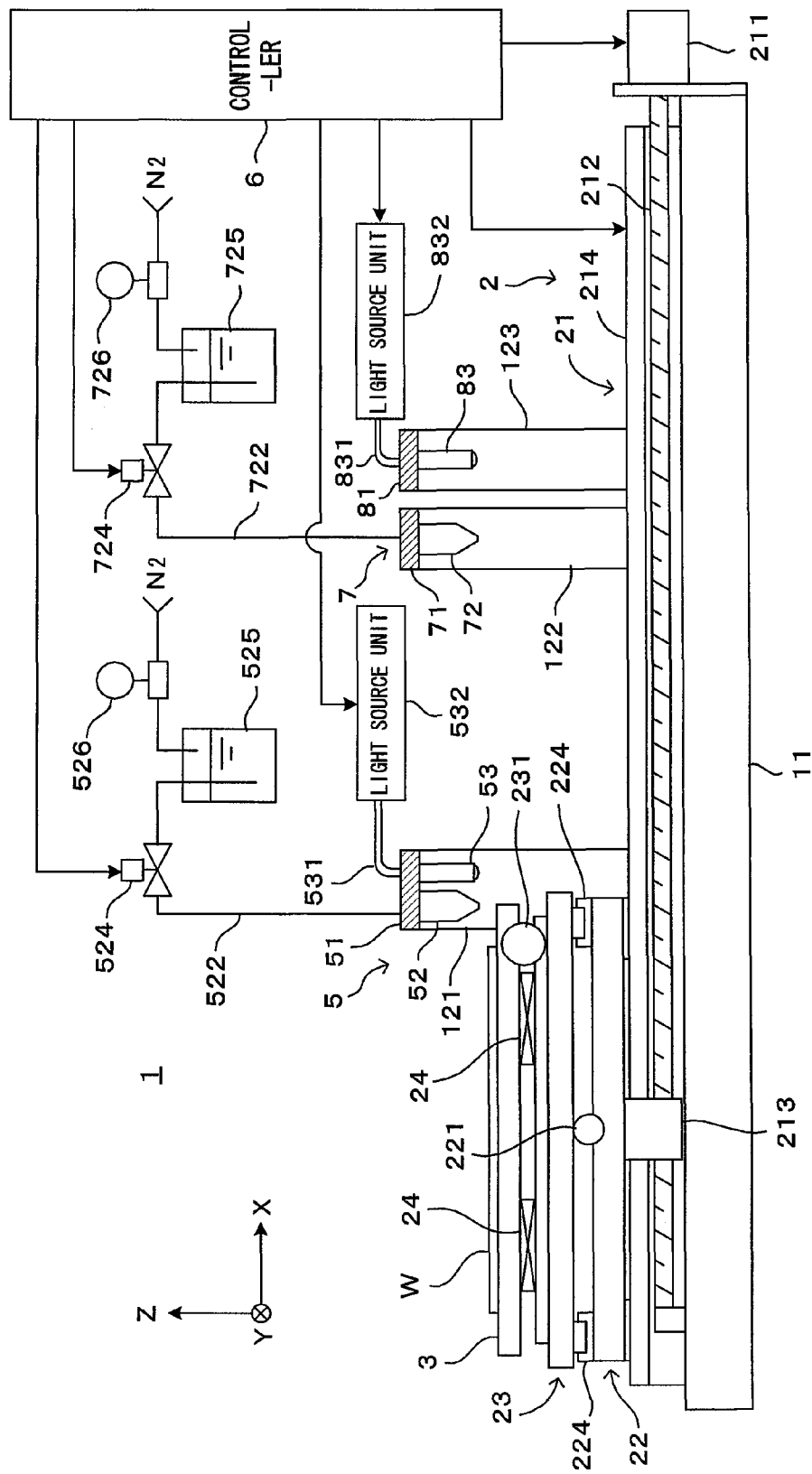
FIG. 4 is a drawing which shows an electrode forming apparatus according to an embodiment of the invention.

FIG. 4 is a drawing which shows an electrode forming apparatus according to an embodiment of the invention. The electrode forming apparatus 1 is an apparatus for forming conductive electrode interconnections on the substrate W, such as a single-crystalline silicon wafer, which has in its surface a photoelectric conversion layer, and accordingly manufacturing a photoelectric conversion device which will be used as a solar cell for instance. The apparatus 1 may for example be used to form collector electrodes in the incident light-receiving surface of a photoelectric conversion device, as a preferable application.

In the electrode forming apparatus 1, a stage moving mechanism 2 is provided on a stand 11 so that the stage moving mechanism 2 can move a stage 3 which holds the substrate W within the X-Y plane which is shown in FIG. 4. Three frames 121, 122 and 123 are mounted to the stand 11, straddling the stage 3. A first head part 5 is attached to the frame 121, and a second head part 7 is attached to the frame 122. The second head part 7 is away from the first head part 5 in the direction (+X), and the distance between the first head part 5 and the second head part 7 is set to be wider than the length of the substrate W measured in the X-direction.

The stage moving mechanism 2 comprises an X-direction moving mechanism 21 for moving the stage 3 in the X-direction, a Y-direction moving mechanism 22 for moving the stage 3 in the Y-direction, and a θ rotation mechanism 23 for rotating the stage 3 about an axis which is directed to the Z-direction. The X-direction moving mechanism 21 has a structure that a ball screw 212 is linked to a motor 211 while a nut 213 fixed to the Y-direction moving mechanism 22 is attached to the ball screw 212. A guide rail 214 is fixed above the ball screw 212. As the motor 211 rotates, the Y-direction moving mechanism 22 smoothly moves together with the nut 213 in the X-direction along the guide rail 214.

The Y-direction moving mechanism 22, too, comprises a ball screw mechanism and a guide rail 224 so that as a motor 221 rotates, the ball screw mechanism makes the θ rotation mechanism 23 move in the Y-direction along the guide rail 224. A motor 231 disposed to the θ rotation mechanism 23 rotates the stage 3 about the axis which is directed toward the Z-direction. The structure described above makes it possible to change the direction of relative movement of the first head part 5 and the second head part 7 to the substrate W and the directions of the first head part 5 and the second head part 7 to the substrate W. A controller 6 controls the respective motors of the stage moving mechanism 2.

A stage elevating/lowering mechanism 24 is disposed between the θ rotation mechanism 23 and the stage 3. In response to a control command from the controller 6, the stage elevating/lowering mechanism 24 moves the stage 3 up or down, whereby the substrate W is positioned at a designated height (which is a position in the Z-direction). The stage elevating/lowering mechanism 24 may be an actuator such as a solenoid and a piezo-electric element, a gear, combined wedges, etc.

The first head part 5 comprises, at the bottom surface of the base 51, a discharge nozzle part 52 for discharging a liquid-state application liquid onto the substrate W. A light irradiation part 53 for irradiating UV light (ultraviolet light) toward the substrate W, and a supply pipe 522 is attached to the discharge nozzle part 52. The supply pipe 522 is connected via a control valve 524 with a tank 525 for storing the application liquid which contains the electrode material. Nitrogen gas is fed into the tank 525 from a nitrogen gas (N2) supply source not shown via a regulator 526, thereby pressurizing the application liquid inside the tank 525 to a constant pressure. As the controller 6 controls opening and closing of the control valve 524, on/off of discharging of the application liquid from the discharge nozzle part 52 is controlled.

The light irradiation part 53 is connected to a light source unit 532 which generates UV light through an optical fiber 531. Although not shown, the light source unit 532 comprises at its light emitting part a shutter which can be opened and closed, and in accordance with whether the shutter is open or closed and to which degree the shutter is opened, the light source unit can control on/off and the amount of emitted light. The controller 6 controls the light source unit 532.

A base 71 and a discharge nozzle part 72 are disposed similarly to the second head part 7, and a supply pipe 722, a control valve 724, a tank 725, a regulator 726 and the like are connected to the discharge nozzle part 72.

In the frame 123 provided adjacent to the frame 122 which seats the second head part 7, a light irradiator 83 is attached to a base 81. An optical fiber 831 and a light source unit 832 are connected to the light irradiator 83. The functions of the respective structure units are the same as those of their counterpart units which are disposed around the first head part 5. The frame 123 is capable of freely sliding in the X-direction so that it is possible to change the distance between the discharge nozzle part 72 and the light irradiator 83.

Figure 5A:
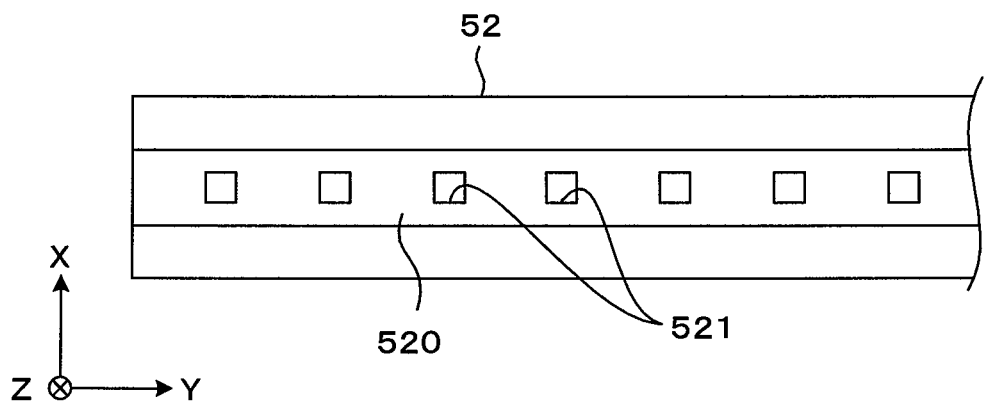
FIGS. 5A and 5B are drawings which show expanded views of the structure of the bottom surface of the discharge nozzle in more detail.
Figure 5B:
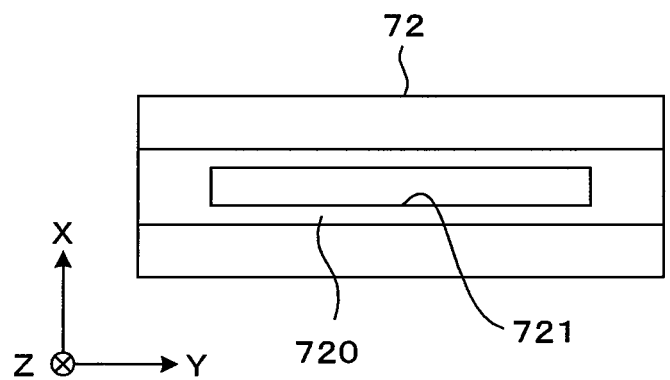

FIGS. 5A and 5B are drawings which show expanded views of the structure of the bottom surface of the discharge nozzle in more detail. More specifically, FIG. 5A is a view which shows a part near the front tip of the discharge nozzle part 52 as viewed from below. FIG. 5B is a view which shows the vicinity of the front tip of the discharge nozzle part 72 as viewed from below. The discharge nozzle part 52 is hollow inside, and as shown in FIG. 5A, has a structure that its bottom surface 520 is perforated with a number of discharge outlets 521 linking to this cavity which are equidistant to each other in the Y-direction. An application liquid fed from the tank 525 via the supply pipe 522 is discharged toward the substrate W at the discharge outlets 521 which are provided in the nozzle bottom surface 520.

Meanwhile, as shown in FIG. 5B, in the discharge nozzle part 72, one wide discharge outlet 721 extending in the Y-direction is bored in the bottom surface 720, and an application liquid from the tank 725 via the supply pipe 722 is discharged toward the substrate W from the discharge outlet 721 which is provided in the nozzle bottom surface 720. The application liquid thus applied to the substrate W hardens under irradiated light and accordingly becomes the bus electrodes B. One or plural discharge nozzle parts 72 are provided side by side in the Y-direction in the second head part 7 in accordance with the number of the bus electrodes B. As there are two bus electrodes B in the example of the module M shown in FIG. 1, two discharge nozzle parts 72 are provided. Like the discharge nozzle part 52 for the finger electrodes, one discharge nozzle part 72 which is thin and long in the Y-direction may be discharged and an appropriate number of discharge outlets 721 considering the number of the bus electrodes may be provided in this discharge nozzle.

In this electrode forming apparatus 1, the tanks 525 and 725 are filled with the application liquids which have been prepared to contain the electrode materials for the finger electrodes F and the bus electrodes B, and the application liquids are applied to the substrate W in which a photoelectric conversion layer has already been formed, whereby the solar cell module M is accordingly manufactured.

The application liquids may be conductive and photo-curing paste-like mixed liquids containing conductive particles, an organic vehicle (namely, a mixture of a solvent, a resin, a thickener, etc.) and a photo-polymerization initiator for instance. The conductive particles may for example be silver powder which is a material to make electrodes, and the organic vehicle contains ethyl cellulose, which serves as a resin material, and an organic solvent. The viscosity of the application liquids is preferably 50 Pa·s (Pascal seconds) or below for instance before execution of hardening under irradiated light but preferably 350 Pa·s or above after execution of hardening under irradiated light. The compositions of the application liquids stored in the tanks 525 and 725 may be the same, or alternatively, the application liquids having different compositions from each other may be stored in the respective tanks.

Figure 6A:
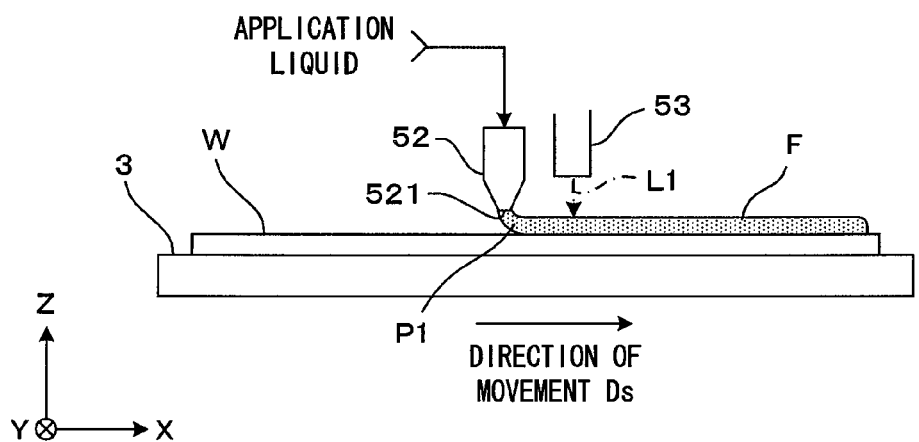
FIGS. 6A and 6B are drawings which schematically show how the finger electrodes are formed.
Figure 6B:
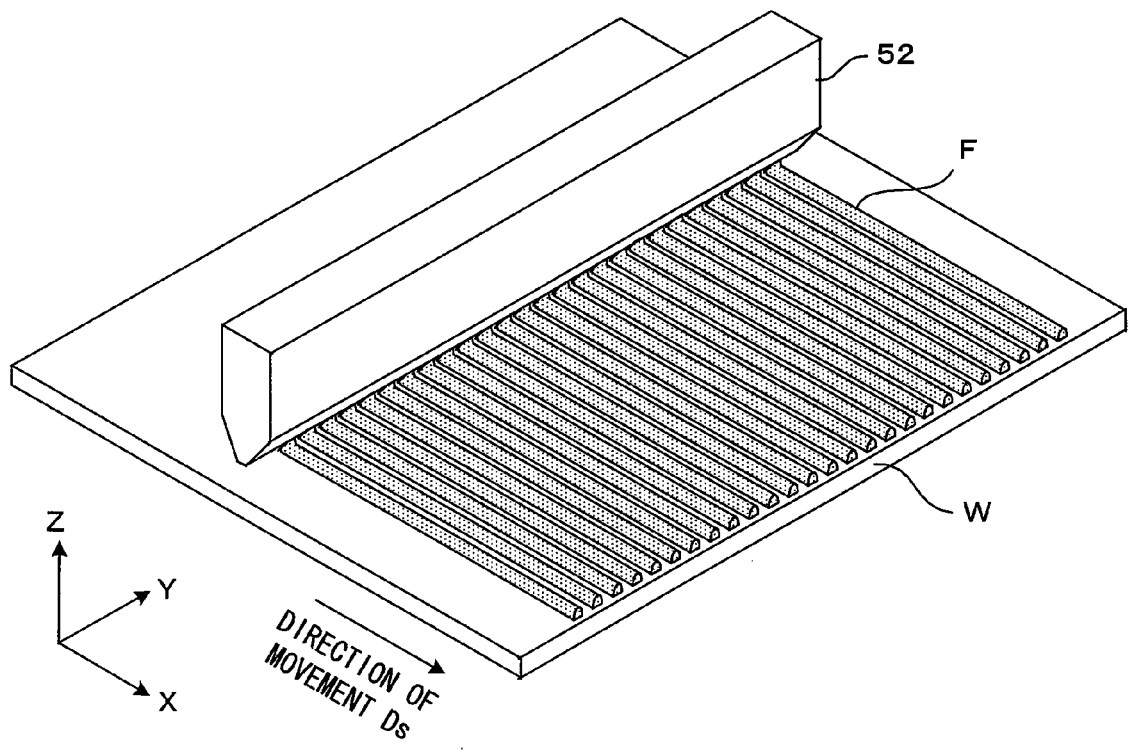

FIGS. 6A and 6B are drawings which schematically show how the finger electrodes are formed. More specifically, FIG. 6A is a drawing which shows discharging of the application liquid at the discharge nozzle part 52 as viewed from the Y-direction, and FIG. 6B is a drawing of the same as viewed from above at an angle. In the electrode forming apparatus 1, while the stage moving mechanism 2 moves the substrate W placed on the stage 3 in the X-direction, the discharge nozzle part 52 discharges at its outlet 521 the application liquid. Hence, the application liquid P1 applied onto the substrate W moves in the X-direction (i.e., to the right-hand side in the drawings) together with the substrate W. In terms of scanning relative to the substrate W, to move the first head part 5 against the fixed substrate W would be equivalent. However, since various types of pipes are connected to the first head part 5 and for the purpose of suppressing changes of the discharged volume due to nozzle vibration, it is preferable that the substrate W is moved and the first head part 5 is fixed.

The light irradiation part 53 is disposed on the downstream side to the discharge nozzle part 52 in the substrate movement direction Ds and irradiates light L1 (which may for example be ultraviolet light) upon the application liquid P1 applied to the substrate W. At the light irradiation position where the light L1 irradiates the substrate W, hardening starts under the irradiated light from the light irradiation part 53 since the application liquid contains the photo-curing resin. As the photo-curing resin is added to the application liquid which contains the electrode material and as the application liquid right after application is irradiated with light and made to harden in this manner, it is possible to form the finger electrodes F which are narrow and tall and which have a high aspect ratio.

Following this, the direction of the substrate W is changed before forming the bus electrodes B. In the condition that the finger electrodes F have been formed in the manner described above, the stage 3 mounting the substrate W is located between the first head part 5 and the second head part 7. The θ rotation mechanism 23 rotates the stage 3 about the Z-axis 90 degrees. This changes the direction of extension of the finger electrodes F from the X-direction to the Y-direction.

Figure 7A:
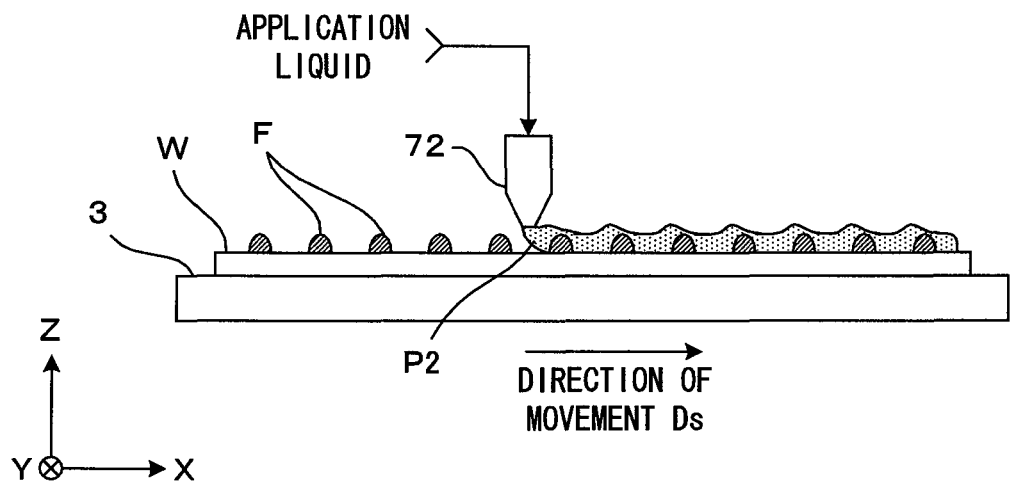
FIGS. 7A and 7B are drawings which schematically show how the bus electrodes are formed.
Figure 7B:
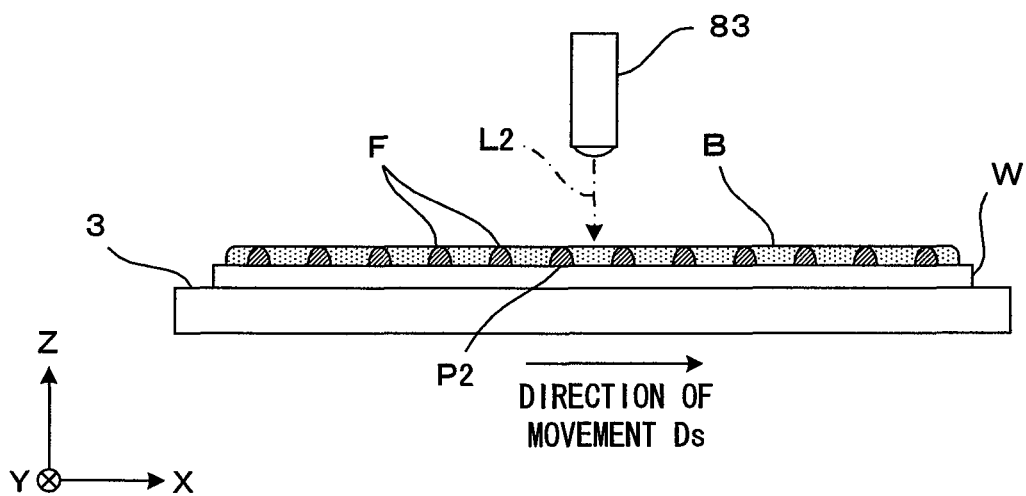

FIGS. 7A and 7B are drawings which schematically show how the bus electrodes are formed. FIG. 7A is a drawing which shows discharging of the application liquid from the discharge nozzle part 72 as viewed from the Y-direction. The movement direction Ds in which the stage 3 and the substrate W move is the X-direction, which is the same as in the case of forming the finger electrodes. However, since the substrate W has been rotated 90 degrees and the direction of extension of the finger electrodes F has accordingly become the Y-direction, the application liquid P2 discharged from the discharge nozzle part 72 is applied to the W substrate so as to orthogonally intersect the finger electrodes which have already been formed. Therefore, in the vicinity of the intersections with the finger electrodes F, the application liquid P2 builds up thick.

As the application liquid is left as such for the time period Ts which has been set earlier, the embossments of the application liquid P2 shrink down to or below the maximum permissible height difference due to leveling of the application liquid P2 as shown in FIG. 7B. At this timing therefore, the light irradiator 83 irradiates light L2 so that the application liquid P2 hardens and the height differences between the bus electrodes B as they are after hardening and the finger electrodes F decrease. It is thus possible to obtain the solar cell module M in which the finger electrodes F and the bus electrodes B shown in FIG. 1 intersect each other and the electrodes have almost no height difference at the intersections.

A specific method of adjusting the time since application of the application liquid for bus electrodes until irradiation of light will now be described. Various types of methods may be applicable to time adjustment, some of which will be individually described below.

FIGS. 8A, 8B, 8C, 8D, 8E, 8F and 8G are drawings which schematically show the first embodiment of time adjustment. In this embodiment, with the discharge nozzle part 72 and the light irradiator 83 positioned close to each other (i.e., at the relative positions to each other shown in FIG. 4), the substrate W is moved and scanned twice immediately under them. Applying the application liquid alone is performed during the first movement, while light irradiation alone is performed during the second movement. Utilizing the interval between these two rounds of scanning/movement, the time since applying until light irradiation is adjusted.

Figure 8A:
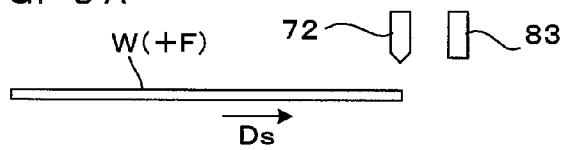
FIGS. 8A, 8B, 8C, 8D, 8E, 8F and 8G are drawings which schematically show the first embodiment of time adjustment.
Figure 8B:
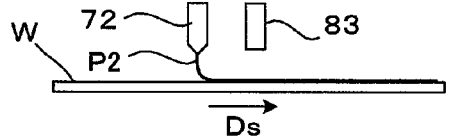
Figure 8C:
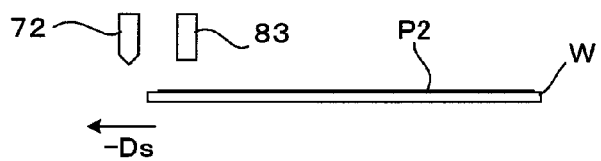
Figure 8D:
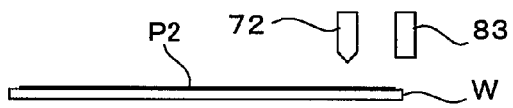

The specific procedure is as described below. As shown in FIG. 8A, the substrate W on which the finger electrodes F have been formed is positioned on the upstream side to the discharge nozzle part 72. As shown in FIG. 8B, the substrate W is moved in the direction Ds denoted at the arrow while the discharge nozzle part 72 discharges the application liquid P2, the application liquid P2 is applied onto the substrate W. The light irradiator 83 does not irradiate light at this stage. As applying to the substrate W finishes, the substrate W is moved in the opposite direction (the direction −Ds) as shown in FIG. 8C and then returned back to the position which is shown in FIG. 8D. The substrate W remains on standby in this state for a while. The controller 6 determines the standby time based on the preferable time difference Ts which has been calculated earlier.

Figure 8E:
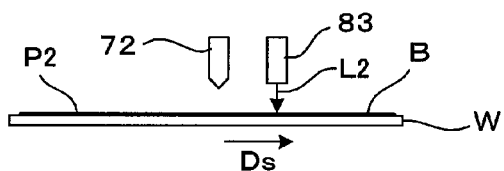
Figure 8F:
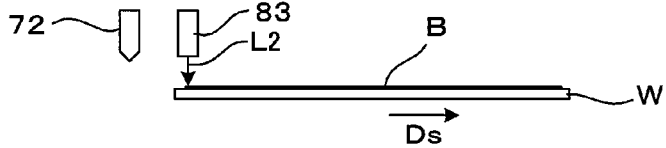

Following this, as shown in FIG. 8E, the substrate W is now moved in the direction Ds while the light irradiator 83 irradiates light L2 but the discharge nozzle part 72 refrains from discharging. As light irradiation upon the application liquid P2 thus applied upon the substrate W finishes, the hardened bus electrodes B are formed on the substrate W as shown in FIG. 8F.

Figure 8G:
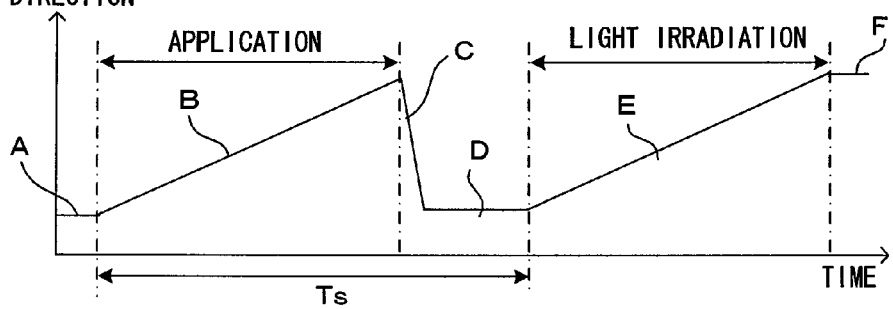

FIG. 8G shows changes with time of a position in the X-direction of a single point on the substrate W during the operation described above, where the symbols A through F respectively correspond to the conditions shown in FIGS. 8A through 8F. As the duration of the standby time denoted at the symbol D is adjusted, the time difference from applying the application liquid until irradiation of light becomes the preferable value Ts calculated earlier. Since the time difference between applying and light irradiation becomes constant at the respective positions within the bus electrodes B when the speed at which the substrate W moves remains the same between during applying and during light irradiation, the height of the bus electrodes B becomes constant. When the time difference since the start of applying until the start of light irradiation is set to the value Ts mentioned above, the height difference between the bus electrodes B and the finger electrodes F is regulated to the maximum permissible height difference or lower. Instead of keeping the substrate W still and on standby, the speed for returning the substrate W back to the original position may be adjusted.

Figure 9A:
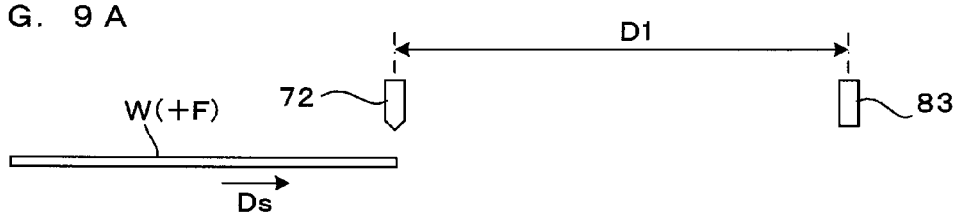
FIGS. 9A, 9B, 9C, 9D and 9E are drawings which schematically show the second embodiment of time adjustment.

FIGS. 9A, 9B, 9C, 9D and 9E are drawings which schematically show the second embodiment of time adjustment. In the second embodiment, the time difference is adjusted as the substrate W moves at a constant speed and while changing the distance between the discharge nozzle part 72 and the light irradiator 83. In other words, as the frame 123 which mounts the light irradiator 83 moves in the X-direction on the stand 11, the distance D1 from the discharge nozzle part 72 to the light irradiator 83 is set to a value which corresponds to the time difference Ts as shown in FIG. 9A.

Figure 9B:
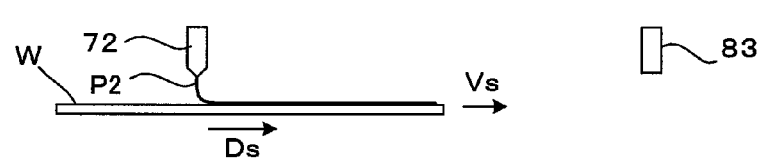
Figure 9C:
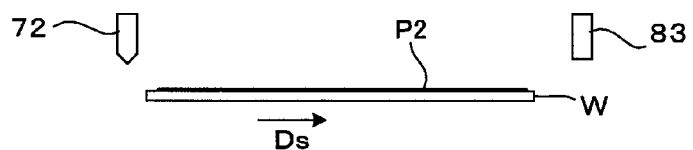
Figure 9D:
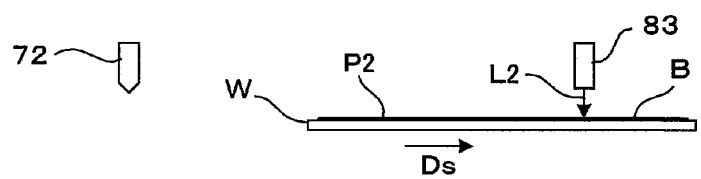

Next, as shown in FIG. 9B, while the discharge nozzle part 72 discharges the application liquid P2, the substrate W moves at a constant speed Vs in the direction Ds. The substrate W is further moved at the same speed even after applying has finished as shown in FIG. 9C and allowed to move passed right under the light irradiator 83 as shown in FIG. 9D, whereby the application liquid P2 is irradiated with light L2. Whether the light irradiator 83 emits light or not may be determined as desired until the substrate W reaches right under the light irradiator 83.

Figure 9E:
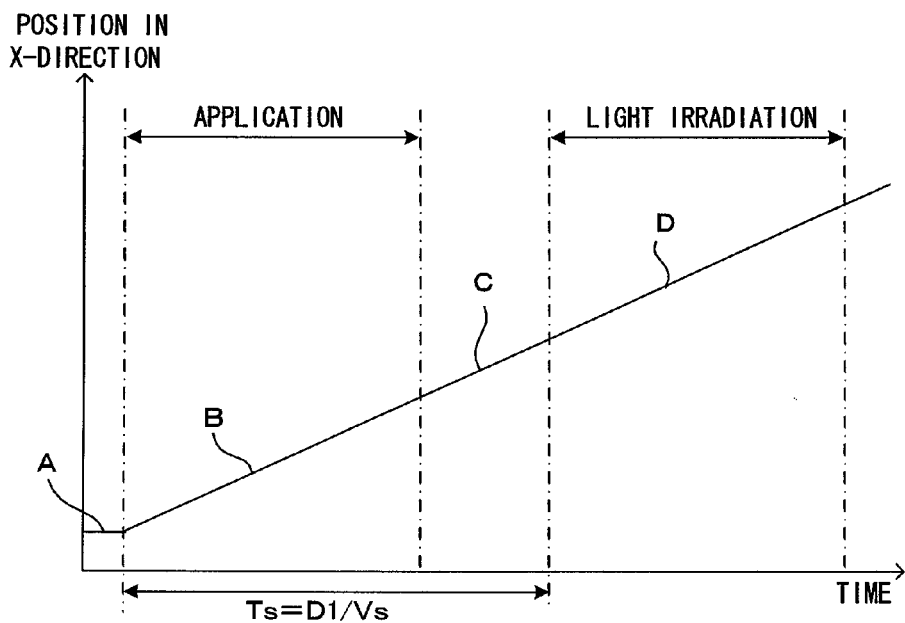

FIG. 9E shows changes with time of a position in the X-direction of a single point on the substrate W during this, where the symbols A through D respectively correspond to the conditions shown in FIGS. 9A through 9D. As shown in FIG. 9E, in this embodiment, the time from applying until light irradiation is determined by the speed Vs of the substrate W and the distance D1 between the discharge nozzle part 72 and the light irradiator 83. As these two values are set appropriately, the time difference Ts is ensured.

Figure 10A:
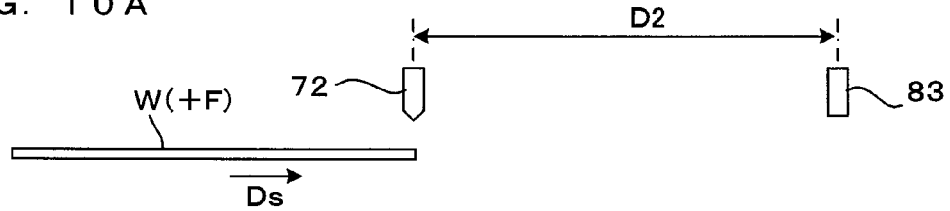
FIGS. 10A, 10B, 10C, 10D and 10E are drawings which schematically show the third embodiment of time adjustment.
Figure 10B:
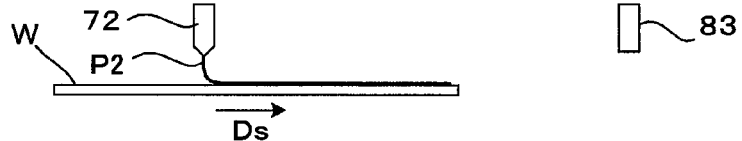
Figure 10C:
Figure 10D:
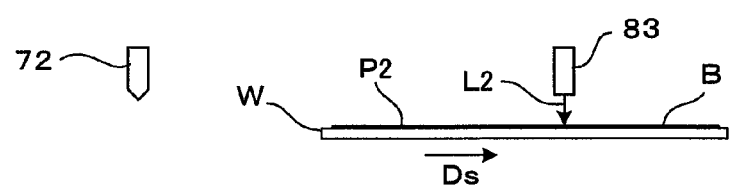

FIGS. 10A, 10B, 10C, 10D and 10E are drawings which schematically show the third embodiment of time adjustment. In this embodiment, as shown in FIG. 10A, the distance between the discharge nozzle part 72 and the light irradiator 83 is fixed to a value D2 which is larger than the length of the substrate W in the X-direction. After application of the application liquid P2 from the discharge nozzle part 72 as shown in FIG. 10B, the substrate W is maintained still between the discharge nozzle part 72 and the light irradiator 83 as shown in FIG. 10C. After a constant time period determined by the controller 6 in accordance with the time difference Ts, the substrate W is started moving again in the direction Ds and the light irradiator 83 irradiates light L2 upon the application liquid P2 as shown in FIG. 10D.

Figure 10E:
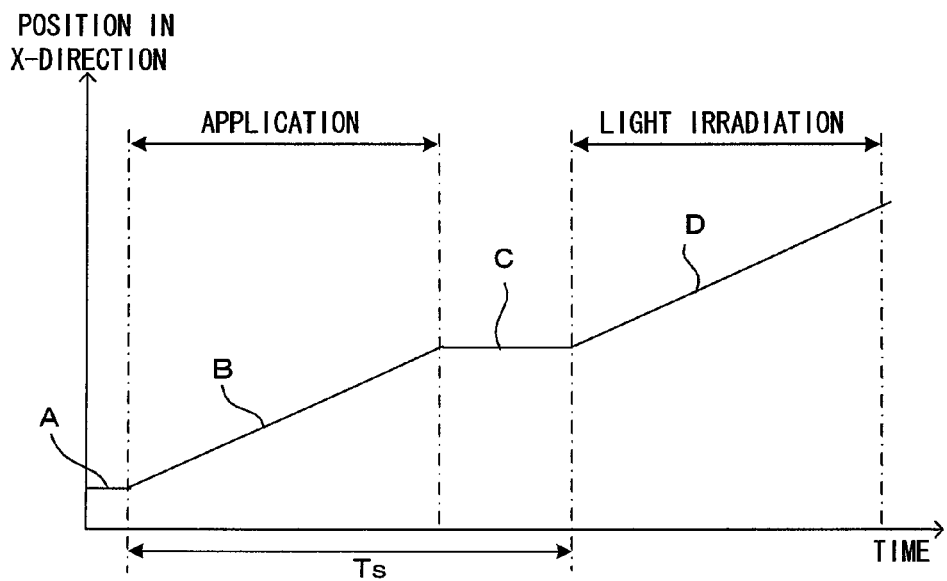

FIG. 10E shows changes with time of a position in the X-direction of a single point on the substrate W during this, where the symbols A through D respectively correspond to the conditions shown in FIGS. 10A through 10D. In this embodiment, after application of the application liquid, it is possible to adjust the time difference in accordance with the hold time until starting of light irradiation.

As described above, when the finger electrodes F and the bus electrodes B are to be formed by applying of the application liquid to the substrate W of the solar cell, the embodiments demand first forming the finger electrodes F which have a narrow line width and then forming the bus electrodes B which have a wider line width. With respect to the finger electrodes F, the application liquid is irradiated with light immediately after getting applied to thereby ensure a high aspect ratio. Meanwhile, as for the bus electrodes B, the time difference from applying to light irradiation is adjusted, thereby ensuring the time (flattening time) for the application liquid which has built up in the vicinity of the intersections with the finger electrodes to spread out. Managing the time difference from applying to hardening in this fashion, the electrode forming method and the electrode forming apparatus according to the invention make it possible to form mutually intersecting electrodes with less height differences particularly at the intersections.

In addition, as the substrate movement speed during application of the application liquid and the substrate movement speed during light irradiation are set to be equal to each other and as the time difference since the start of applying until the start of light irradiation is managed, the height of the bus electrodes becomes almost constant and approximately equal to that of the finger electrodes.

As described above, in the electrode forming apparatus 1, the stage 3 functions as the "substrate holder" of the invention, while the discharge nozzle part 72 functions as the "nozzle" of the invention. The stage moving mechanism 2 functions as the "mover" of the invention, and the light irradiator 83 functions as the "hardener" and the "light irradiator" of the invention. With respect to the time adjustment method described above, the controller 6 functions as the "adjuster" of the invention according to the first and the third embodiments, and the frame 123 functions as the "adjuster" of the invention according to the second embodiment.

The invention is not limited to the embodiments described above but may be modified in various manners in addition to the embodiments above, to the extent not deviating from the object of the invention. For instance, although the embodiments above require application of the application liquid and light irradiation upon the application liquid to form the finger electrodes F, the method for forming the finger electrodes may be any desired method and is not limited to application from the nozzle. Further, light irradiation is not essential to form the finger electrodes. In addition, the substrate already seating the finger electrodes may be loaded into the electrode forming apparatus and the bus electrodes alone may be formed.

Further, although the copper ribbon is soldered to the bus electrodes in the embodiments above, this step is not essential. Further, a step of sintering electrodes may be added after light irradiation. In this case, sintering may be performed after the finger electrodes are formed and again after the bus electrodes are formed or only one time after forming the bus electrodes.

Further, while the light irradiator 83 is moved relatively to the substrate W at the same speed as the speed of the discharge nozzle part 72 so that the time difference between application of the application liquid and light irradiation upon the application liquid becomes almost unchanged at the respective positions according to the embodiments above, this is not limiting. As shown in FIG. 3B, since the reduction of the maximum height Hm of the application liquid becomes smaller with time, in the event that the application liquid which is highly viscous and has a long flattening time is used, a certain delay if any in starting light irradiation will not be influential very much. Therefore, after application of the application liquid for bus electrodes to the substrate, the application liquid as a whole may be irradiated with light. In this instance, the time difference since the start of applying until the start of light irradiation may be set to the value Ts or the time difference since the end of applying until the start of light irradiation may be set to the value Ts.

Further, although the time difference Ts is experimentally determined based on application of the application liquid to the sample substrates in the embodiments described above, instead of relying upon an experiment, the time difference Ts may be calculated through computation from the physical property values of the application liquid. Alternatively, the time differences Ts calculated in advance for different types of the application liquid may be saved as a table, and a preferable one of the time differences Ts may be retrieved from the table and applied as the application liquid is chosen.

Further, the embodiments described above require calculating the time difference Ts in advance. However, the time difference between applying and light irradiation may be determined before irradiating light. In this sense, the following may be performed. That is, a height detection sensor for measuring the height of the application liquid applied to the substrate may be disposed to the electrode forming apparatus, and as the height detection sensor senses that the application liquid for bus electrodes has reached the predetermined height on the substrate, light irradiation may be initiated. With respect to the height of the application liquid, for the reason described above, it is preferable to detect it not immediately above the finger electrodes but at downstream side positions to these positions in the nozzle movement direction, and it is more preferable to detect it at the downstream side position to the first one of the finger electrodes which comes crossing the application liquid.

Further, according to the embodiments described above, when forming the bus electrodes, the application liquid which contains the electrode material and the photo-curing material is applied to the substrate and made to harden under irradiated light to form the bus electrodes. However, a method of hardening the application liquid is not limited to irradiation with light. For example, a carbon dioxide gas laser which emits infrared light may be used as a heater/hardener, and with infrared light irradiated upon the application liquid which has been applied to the substrate, the application liquid may be heated and made to harden. Alternatively, as a heater may be placed in the vicinity of the application liquid or heated air may be blown to the application liquid to heat and harden the application liquid. Alternatively, evaporation of a solvent component contained in the application liquid may be encouraged as the ambient atmosphere around the substrate is reduced. Furthermore, alcohol or the like may be supplied to the application liquid which has been applied and the application liquid may be hardened due to substitution of the solvent. In these instances, the application liquid does not need to contain a photo-curing material. Meanwhile, in the case that the application liquid for bus electrodes is to be hardened at one time after having been applied, infrared light may be irradiated entirely upon all areas to which the application liquid for bus electrodes has been applied or a heater or the like opposed to all applied areas may be disposed.

Further, although the electrode interconnections are formed on the silicon substrate to fabricate the photoelectric conversion device which will serve as a solar cell according to the embodiments described above, the substrate is not limited to silicon. The invention is applicable also to formation of electrodes for a thin-film solar cell formed on a glass substrate, other devices than solar cells, etc., for instance.

In these inventions, for example, the application liquid may be applied to the substrate on which the finger electrodes have already been formed, and the time since applying until a difference between the maximum height of the application liquid and the height of the finger electrodes becomes a predetermined permissible height difference may be estimated in advance and defined as the predetermined time. As post-applying light irradiation is performed after thus set time, the height differences of thus formed electrodes are contained within the tolerable range.

Further, for instance, at the applying step, the application liquid which contains a photo-curing material may be applied to the substrate and the application liquid applied to the substrate may be irradiated with light. As light is irradiated upon the application liquid which contains the electrode material and the photo-curing material, the application liquid hardens under light irradiation and the electrodes are formed.

In this instance, at the hardening step, a light irradiator for irradiating the light may be moved relative to the substrate in the second direction at the same speed or approximately at the same speed as the speed of the nozzle. As a result of this, the time since applying the application liquid until light irradiation becomes almost constant at the respective positions in the bus electrodes, and variations of the heights of the bus electrodes are suppressed.

At the finger electrode forming step, the application liquid which contains the electrode material may be discharged from a nozzle and applied to the substrate and the finger electrodes are formed. Although the invention is viable whichever the method of forming the finger electrodes may be, where the so-called nozzle dispensing as described above is utilized, it is possible to efficiently form a great number of fine electrode patterns such as finger electrodes. In this instance, as the nozzle discharges the application liquid which contains the photo-curing material in addition to the electrode material and the application liquid is exposed to irradiated light immediately after discharged and made to harden, the finger electrodes whose height has a high ratio to its width, i.e., which have a high aspect ratio are formed.

The invention is preferably applicable to where the finger electrodes and the bus electrodes are formed on a photoelectric conversion surface of a photoelectric conversion element which serves as the substrate. Electrodes desirable for such a photoelectric conversion element are electrodes which do not block incident light as much as possible and have low electric resistance. Making it possible to form electrodes whose heights in cross section are tall over an appropriate width, the electrode forming method according to the invention is preferable to such an application.

Further, in the electrode forming apparatus of the present invention, for example, the hardener may be a light irradiator which irradiates light upon the application liquid applied to the substrate. This structure permits to use the application liquid which contains the photo-curing material in addition to the electrode material and form the electrodes on the substrate using it.

In this instance, for instance, the mover may move the nozzle and the light irradiator together relative to the substrate, and the adjuster may adjust the distance between the nozzle and the light irradiator taken in the second direction. In this structure, the distance between the nozzle and the light irradiator controls the time since application of the application liquid from the nozzle to the substrate until irradiation of the application liquid with light by the light irradiator, so that spreading of the application liquid at the intersections with the finger electrodes is controlled and the electrodes with less height differences are formed.

Alternatively, the mover may be structured so as to move the light irradiator relative to the substrate, and the adjuster may control the mover to move the nozzle and the light irradiator respectively relative to the substrate and adjust a time until starting to move the light irradiator relative to the substrate after moving the nozzle relative to the substrate. It is possible to control spreading of the application liquid at the intersections with the finger electrodes and form the electrodes having less height differences.

Where the electrode forming method and the electrode forming apparatus according to the invention are used, as the time until hardening of the application liquid containing the electrode material since application of the application liquid to the substrate on which the finger electrodes have been formed is adjusted, it is possible to form electrodes having less height differences with reduced embossments at the intersections of the finger and the bus electrodes.

The invention is preferably applicable to a method of and an apparatus for forming electrodes on a solar cell substrate for instance, and particularly, to formation of finger electrodes and bus electrodes which intersect each other.

Although the invention has been described with reference to specific embodiments, this description is not meant to be construed in a limiting sense. Various modifications of the disclosed embodiment, as well as other embodiments of the present invention, will become apparent to persons skilled in the art upon reference to the description of the invention. It is therefore contemplated that the appended claims will cover any such modifications or embodiments as fall within the true scope of the invention.

What is claimed is:
1. An electrode forming apparatus, comprising:
 a substrate holder for holding a substrate which seats finger electrodes which extend in a first direction;
 a nozzle which discharges an application liquid which contains an electrode material;
 a light irradiator which irradiates light upon the application liquid applied to the substrate so as to harden the application liquid;
 a mover which moves the nozzle and the light irradiator relative to the substrate in a second direction which is different from the first direction; and an adjuster which adjusts a time since application of the application liquid to the substrate until hardening is performed by the light irradiator;

wherein the light irradiator is held so as to be movable relative to the nozzle in the second direction; and wherein the mover moves the nozzle and the light irradiator together relative to the substrate, and the adjuster adjusts a distance between the nozzle and the light irradiator taken in the second direction.

2. The electrode forming apparatus of claim 1, wherein the mover moves the nozzle and the light irradiator together at a known speed relative to the substrate, and the adjuster is a frame which sets a predetermined distance between the nozzle and the light irradiator taken in the second direction so as to set said time.

3. The electrode forming apparatus of claim 1, wherein when the nozzle is moved in the second direction relative to the substrate, the application liquid forms additional electrodes extending in the second direction.

4. An electrode forming apparatus, comprising:

a substrate holder for holding a substrate which seats finger electrodes which extend in a first direction;

a nozzle which discharges an application liquid which contains an electrode material;

a light irradiator which irradiates light upon the application liquid applied to the substrate so as to harden the application liquid;

a mover which moves the nozzle and the light irradiator relative to the substrate in a second direction which is different from the first direction; and an adjuster which adjusts a time since application of the application liquid to the substrate until hardening is performed by the light irradiator;

wherein the mover performs a first movement in which the nozzle discharges the application liquid to the substrate without light irradiation by the light irradiator, and a second movement in which the light irradiator irradiates the light upon the application liquid applied to the substrate without discharge by the nozzle, and the adjuster adjusts a time interval between the first movement and the second movement.

5. The electrode forming apparatus of claim 4, wherein the mover is structured so as to move the light irradiator and the nozzle relative to the substrate, and the adjuster controls the mover so as to set said time, after moving the nozzle relative to the substrate, until starting to move the light irradiator relative to the substrate.

6. The electrode forming apparatus of claim 5, wherein said adjuster controls said mover to pause in its movement and thereby set said time.

7. The electrode forming apparatus of claim 5, wherein said adjuster controls said mover to reverse the direction of movement of said mover and thereby set said time.

8. The electrode forming apparatus of claim 4, wherein when the nozzle is moved in the second direction relative to the substrate, the application liquid forms additional electrodes extending in the second direction.

* * * * *